United States Patent [19]

Sommen et al.

[11] Patent Number: 5,581,494

[45] Date of Patent: Dec. 3, 1996

[54] ADAPTIVE DISCRETE-TIME TRANSVERSAL FILTER

[75] Inventors: Petrus C. W. Sommen; Christinus J. Van Valburg, both of Eindhoven, Netherlands

[73] Assignee: U.S. Philips Corporation, New York, N.Y.

[21] Appl. No.: 522,438

[22] Filed: May 11, 1990

[30] Foreign Application Priority Data

May 19, 1989 [NL] Netherlands .......................... 8901247

[51] Int. Cl.$^6$ .................................................. G06F 15/31
[52] U.S. Cl. ................................. 364/724.16; 364/724.19
[58] Field of Search ........... 364/724.16, 274.18–724.19, 364/724.2

[56] References Cited

U.S. PATENT DOCUMENTS

| | | | |
|---|---|---|---|
| 4,591,669 | 5/1986 | Buttweiler et al. | 364/724.16 X |
| 4,791,390 | 12/1988 | Harris et al. | 364/724.19 X |
| 4,939,685 | 7/1990 | Feintuch | 364/724.19 |
| 4,947,362 | 8/1990 | Bui | 364/724.19 |
| 4,989,170 | 1/1991 | Batruni et al. | 364/724.19 |

OTHER PUBLICATIONS

"Digital Echo Cancellation for Baseband Data Transmission"; IEEE Trans. ASSP, vol. ASSP–27, No. 6, Dec. 1979, pp. 768–781, N.A.M. Verhoeckx.

"Adaptive Signal Processing" by B. Widrow and S. D. Stearns, Prentice Hall; 1985, pp. 99–114, and 182–183.

"An Adaptive Filtering Algorithm Using an Orthogonal Projection to an Affine Subspace and its Properties", by K. Ozeki and T. Umeda in Electronics & Comm. in Japan, vol. 67A, No. 5, 1984, pp. 19–27.

"Linear Prediction of Speech" J. D. Markel et al, Springer Verlag, 1976, pp. 144–157.

"Convergence Analysis of a Frequency Domain . . . ", P. Sommen et al, IEEE Transactions on CAS; vol. CAS 34, No. 7, Jul. 1987.

"A Geometric Interpretation of Adaptive Algorithms" K. Kurosawa et al, Globecom Conference, pp. 49.7.1–49.7.5.

"Algorithms of Adaptive Markov Filtering of Noisy Speech Signals" Nazarov et al Telecommunications & Radio Engineering, vol. 37/38 Dec., 1983.

Primary Examiner—Tan V. Mai
Attorney, Agent, or Firm—Michael E. Schmitt

[57] ABSTRACT

Adaptive discrete-time filters, as used, for example, in echo cancellers responsive to input signals, more specifically speech signals, which can be modelled with an autoregressive process of the order of p, a control circuit for controlling the coefficients for adjusting a discrete-time transversal filter in accordance with an algorithm which requires the same amount of computation as the Least Mean Square (LMS) algorithm but leads to the same or better convergence results for this type of signals than the Orthogonal Projection (OP) algorithm.

4 Claims, 4 Drawing Sheets ns="">

ADAPTIVE DISCRETE-TIME TRANSVERSAL FILTER

BACKGROUND OF THE INVENTION

The invention relates to an adaptive discrete-time transversal filter for forming an estimated echo signal to cancel an unwanted actual echo signal caused by an input signal.

A filter of this type is used, for example, in echo cancellers in loudspeaking telephone sets. In such telephone sets the received signal symbols reproduced by the loudspeaker of a receiving set can be received by the microphone and be re-transmitted. This may lead to unacceptable acoustic feedback ("singing"). The echo canceller in the "sending" set has now for its task to optimise the compensation for its own signal symbols forming an echo signal and received back via the microphone of the receiving set, in order to prevent these symbols reaching the loudspeaker of the sending set. The transversal filter constructs an echo cancelling signal from a linear combination of the most recently sent symbol and the N symbols sent before that symbol, where N depends on the period of time during which the symbol sent by the set itself still influences the symbol received by that set. During each send symbol interval the transversal filter receives for each of the N symbols a coefficient modification from an adaptive control circuit and the contribution of a signal to the echo signal is calculated by multiplying, for each symbol, the associated most recent coefficient by the symbol level. For a description of the adaptive coefficient control in a transversal filter the reader be referred to N.A.M. Verhoeckx et al.: "Digital Echo Cancellation for Baseband Data Transmission"; IEEE Trans. ASSP, Vol. ASSP-27, No. 6, December 1979, pp. 768–781.

In the adaptive control circuit described in the above article, the coefficients are updated during each send symbol interval by means of the "Least Mean Square" (LMS) algorithm. This algorithm is advantageous in that it is simple, requires little computing time and is easy to implement in hardware. However, from "Adaptive Signal Processing", by B. Widrow and S. D. Stearns, Prentice Hall; Englewood Cliffs, N. J., 1985, the convergence properties of the LMS algorithm are known to degrade strongly when the input signal, thus the send signal, is strongly autocorrelated. An example of a strongly autocorrelated input signal is a speech signal, so that the echo cancellation by means of the LMS algorithm meets with problems specifically with the signals transmitted between loudspeaking telephone sets.

In the article entitled "An Adaptive Filtering Algorithm Using an Orthogonal Projection to an Affine Subspace and its Properties", by K. Ozeki and T. Umeda in: Electronics and Communications in Japan, Vol. 67A, No. 5, 1984, pp. 19–27, an adaptive algorithm is described which has good convergence properties also for autocorrelated input signals. As will be further explained hereinbelow, however, the disadvantage of this algorithm is the fact that the number of computations required for each new value of the coefficients is more than twice as large as with the LMS algorithm, which considerably augments the necessary amount of hardware and the necessary computing time.

For example, from "Linear Prediction of Speech" by J. D. Markel and A. H. Gray Jr.; Springer Verlag, 1976, it is known that the unvoiced part x[k] of a speech signal can be approached by an autoregressive model of the order of p (AR(p)) given by:

$$x[k] = \sum_{j=1}^{p} a_j x[k-j] + n[k]$$

where n[k] is a random signal in which on average the various elements of n[k] do not show any mutual correlation.

OBJECT OF THE INVENTION

It is an object of the invention to provide an adaptive discrete-time transversal filter for input signals of the AR(p) type in which during each send symbol interval the coefficients can be computed by means of an algorithm which has convergence properties outperforming those of the algorithm described in the article by K. Ozeki and T. Umeda and which furthermore has a complexity, that is to say, a number of computations necessary for each coefficient, which is comparable to that of the LMS algorithm.

BRIEF DESCRIPTION OF THE DRAWING

The invention will be further explained in the sequel with reference to the drawings, in which.

DETAILED DESCRIPTION OF THE PREFERRED EMBODIMENTS

Figure 1A:
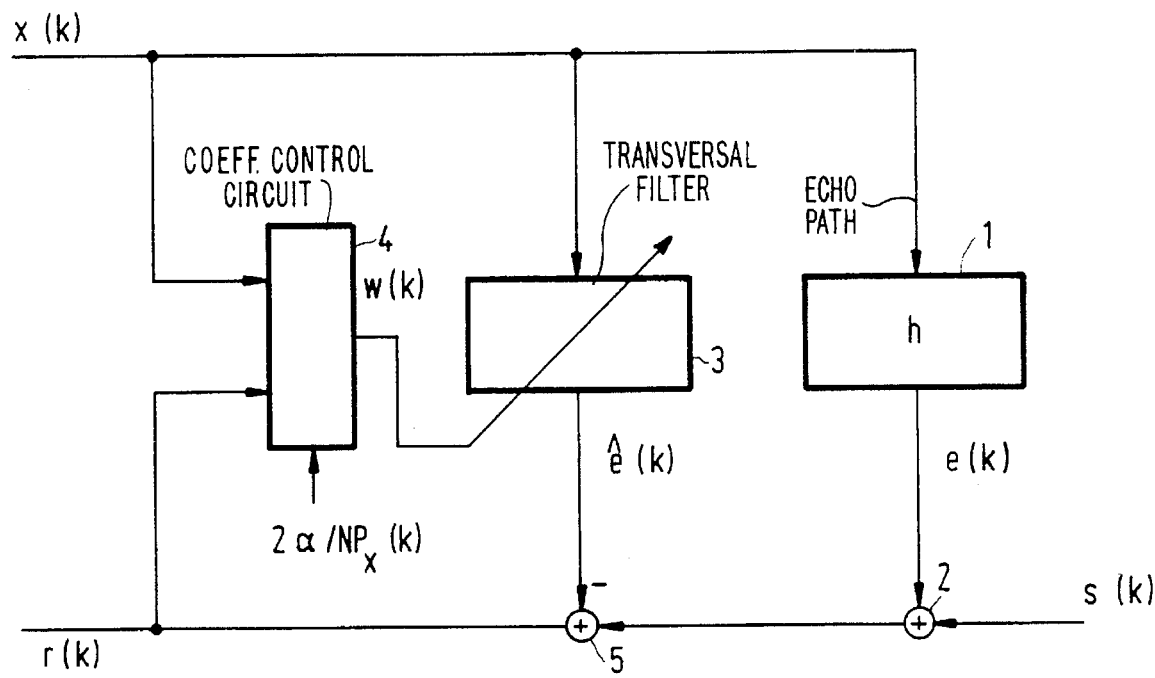
FIGS. 1A, 1B, 1C, show block diagrams of a prior art echo canceller.

FIG. 1A shows a block diagram of a prior art echo canceller in which an adaptive filter according to the invention can be used. A discrete-time input signal x[k] is reflected as an echo signal e[k] through an echo path referenced 1 in the Figure and having an impulse response h. In the case of a connection between loudspeaking telephone sets this echo path is formed by the send path, by the acoustic feedback between the loudspeaker of the receiving set and the microphone thereof and by the send path back to the sending set. In an adder 2 a noise signal s[k] is added to this echo signal. This noise signal represents the disturbing signals not caused by the echo signal and will generally be negligibly small with respect to the echo signal. An adaptive filter, comprising a transversal filter unit 3 used for convolution of signal x[k] with coefficients w[k] and a coefficient control circuit 4, produces an echo signal estimate ê[k] which is subtracted in an adder 5 from the received signal e[k]+s[k], after which a residual signal r[k] remains.

Figure 1B:
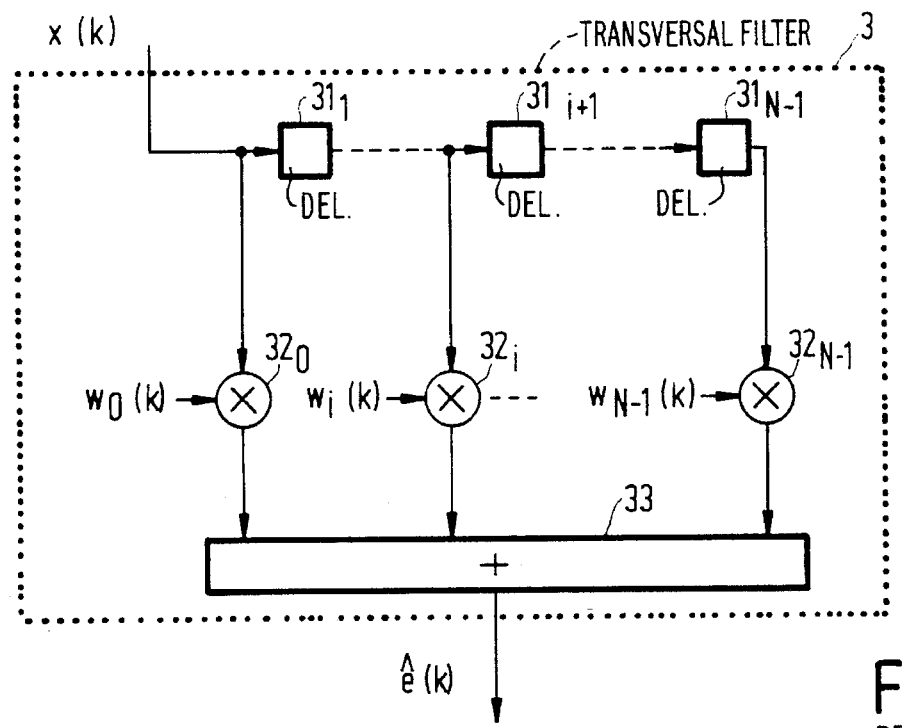

The transversal filter 3 has a structure known per se and shown in FIG. 1B. It comprises N sections each of which, with the exception of the first section, including a delay stage $31_i$ (i=1, 2, ... N−1) to delay the input signal of this stage over a send symbol interval. The undelayed input signal of the first section and the output signals of each of the delay stages $31_i$ are multiplied by a coefficient $w_i[k]$; (i=0, 1, 2, ... , N−1) in a dedicated multiplier $32_i$ (i=0, 1, 2, ... , N−1). The output signals of all the multipliers $32_i$ are added together in a summing circuit 33 to form the echo cancelling signal ê[k].

An algorithm frequently used for the continuous adaptation of the coefficients $w_i[k]$ is the Least Mean Square (LMS) algorithm, in which $w_i[k+1]$ is determined by the formula:

$$w_i[k+1] = w_i[k] + 2\alpha \frac{x[k-i]r[k]}{NP_x[k]} \text{ with} \quad (0)$$
$$i = 0, 1, 2 \ldots N-1$$

Figure 1C:
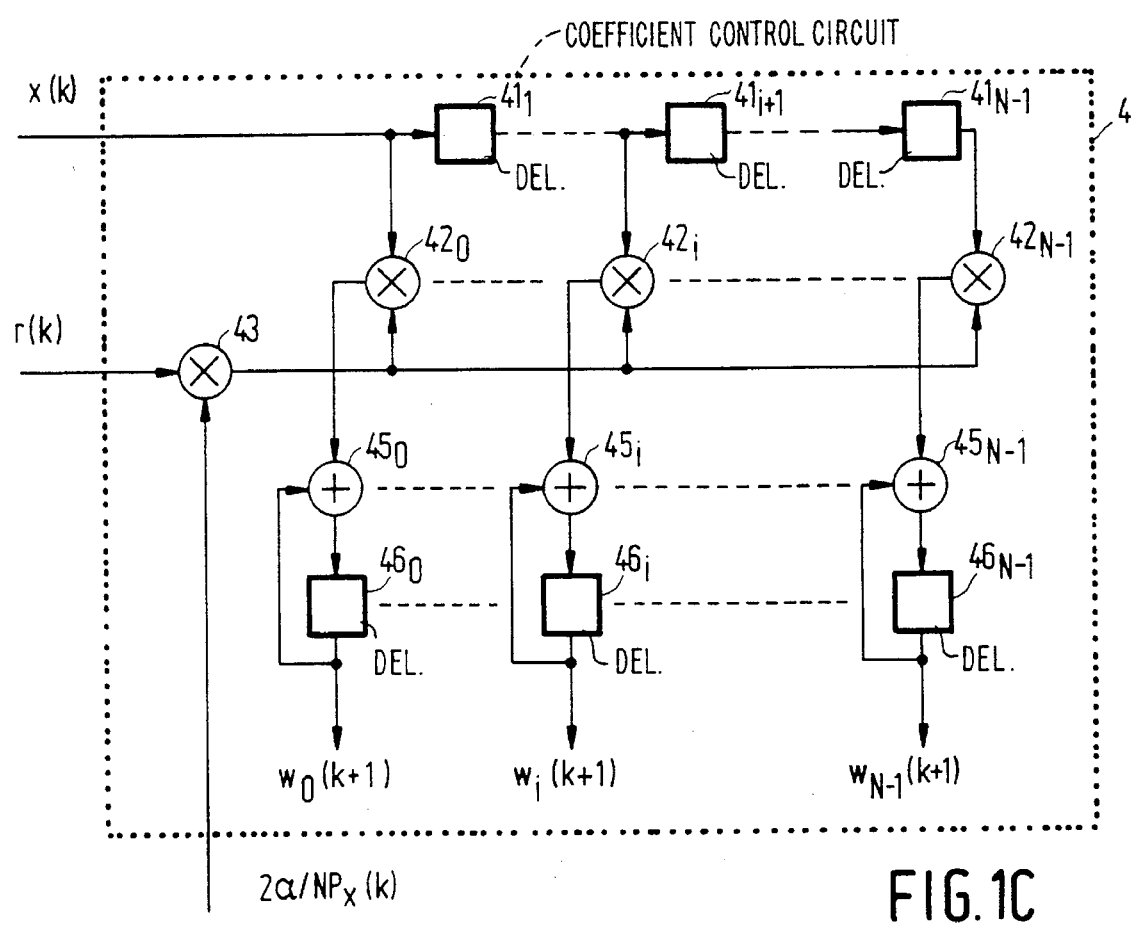

FIG. 1C shows a manner in which this algorithm may be realised. For this purpose, the coefficient control circuit 4 comprises N−1 delay stages $41_i$ to delay the input signal of each stage over a send symbol interval. In practice, the delay lines 31 and 41 will be combined to a single delay line. In a dedicated multiplier $42_i$ the input signal x[k] and the output signal of the delay stage $41_i$ are multiplied by the output signal of a multiplier 43. This multiplier 43 multiplies the residual signal r[k] by a factor $2\alpha/NP_x[k]$. The factor $P_x[k]$ is an estimate of the power of the input signal x[k] and is used for normalising the successive values of $w_i[k]$. $\alpha$ is known as the adaptation constant, with $0<\alpha<1$. In an adder $45_i$ the output signal of the multiplier $42_i$ is added to $w_i(k-1)$, the previous value of $w_i[k]$, produced by a delay stage $46_i$. The output signals of the delay stages $46_i$ satisfy the formula (0), as can simply be verified. The coefficients are adapted according to this formula as long as there is a correlation between x[k−i] and r[k].

In vector notation the LMS algorithm can be represented by:

$$\underline{w}[k+1] = \underline{w}[k] + 2\alpha \frac{\underline{x}[k]r[k]}{\|\underline{x}[k]\|^2} \quad (1)$$

where $$x^T[k]=(x_0[k], \ldots, x_{N-1}[k])$$
$$w^T[k]=(w_0[k], \ldots, w_{N-1}[k])$$

$$\|x[k]\|^2 = <\underline{x}[k],\underline{x}[k]>\underline{x}^T[k].\underline{x}[k]. \quad (2)$$

Here T denotes the transpose of a vector and $<.,.>$ is the symbol for the inner product of two vectors. The residual signal r[k] can be written as:

$$r[k]=\underline{x}^T[k].\underline{d}[k]+s[k]=<\underline{x}[k],\underline{d}[k]>+s[k] \quad (3)$$

where d[k] is defined as:

$$\underline{d}[k]=\underline{h}-\underline{w}[k]. \quad (4)$$

in which $$h^T=(h_0, \ldots, h_{n-1})$$

In formula (1), $\|x[k]\|^2$ is representative of the power normalisation in the LMS algorithm and comparable to $NP_x[k]$ in formula (0). When implementing the LMS algorithm an efficient estimate $P_x[k]$ of $1/N\|x[k]\|^2$ is obtained by reiterating the recursion:

$$P_x[k-1]=\gamma P_x[k]+(1-\gamma)x^2[k] \text{ with } 0<\gamma<1 \quad (5)$$

This is known per se from the article entitled "Convergence Analysis of a Frequency Domain Adaptive Filter with Exponential Power Averaging and Generalized Window Functions" by P. Sommen et al. in IEEE Transactions on CAS; Vol. CAS 34, No. 7, July 1987.

When using (5) and taking the number of multiplications, to be referenced "MD" hereinafter, as a rough measure for the complexity of an algorithm, it appears that a number of MDs of the order of 2N are necessary for calculating during each sample interval the value of ê[k] with the LMS algorithm and adapting the filter coefficients.

As has been stated hereinbefore, one of the main objections to the LMS algorithm is that the convergence properties may degrade considerably if the input signal x[k] is autocorrelated. An example of such an autocorrelated signal is a speech signal whose unvoiced part, as has also been stated hereinbefore, may be approached with an autoregressive signal x[k] of the order of p (AR(p)) which, in vector notation, may be characterised according to:

$$\underline{x}[k] = \sum_{j=1}^{p} a_j \underline{x}[k-j] + \underline{n}[k] \quad (6)$$

where $n^T[k]=(n_0[k], \ldots, n_{N-1}[k])$ represents a random signal. This implies that for all $|i| \leq 1$ it holds that n[k] is statistically independent of n[k−i].

From the above article by K. Ozeki and T. Umeda an adaptive algorithm is known with which the convergence properties may be improved with respect to the LMS algorithm in the case of a strongly autocorrelated input signal. This algorithm is known by the name of Orthogonal Projection method (to be referenced the OP method hereinafter) and will be explained more generally in the sequel for projections in one and two dimensions and subsequently be described for use with signals of the AR(p) type.

Figure 2A:
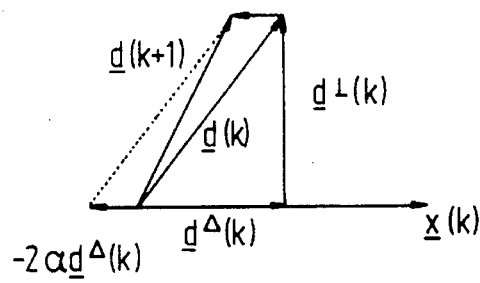
FIGS. 2A, 2B show diagrams for explaining the orthogonal projection method.

The one-dimensional OP method will be explained with reference to FIG. 2A while assuming that s[k]=0, which is often a permissible assumption for applications in acoustics as has been indicated hereinbefore. Because of the projection of the difference vector d[k] on the vector x[k], d[k] is resolved into:

$$d[k]=d^L[k]+d^\Delta[k] \quad (7)$$

where $d^L[k]$ is orthogonal and $d^\Delta[k]$ is parallel with x [k]. This implies that:

$$<\underline{x}[k], \underline{d}^L[k]> = 0 \text{ and} \quad (8)$$
$$\underline{d}^\Delta[k] = c \cdot \underline{x}[k]$$

where c is a random scale factor. By substituting the formulae (8) into formula (3), (with s[k]=0), we will obtain:

$$r[k]=<\underline{x}[k],\underline{d}[k]>=<\underline{x}[k],\underline{d}^\Delta[k]>=c. \|x[k]\|^2$$

From this equation the scale factor c can be computed and together with formula (8) the parallel component $d^\Delta[k]$ may be written as:

$$\underline{d}^\Delta[k] = \frac{\underline{x}[k]r[k]}{\|\underline{x}[k]\|^2} \quad (9)$$

For reducing the residual signal r[k] it is important to change the length and rotation of the vector d[k] in a manner such that it becomes shorter and more orthogonal with respect to x[k]. These conditions ensue directly from formula (3). This may be achieved by subtracting a small part from $d^\Delta[k]$, as shown in FIG. 2A. Thus, the following will hold:

$$\underline{d}[k+1] = \underline{d}[k] - 2\alpha \underline{d}^\Delta[k] = \underline{d}[k] - 2\alpha \frac{\underline{x}[k]r[k]}{\|\underline{x}[k]\|^2}. \quad (10)$$

In combination with the definition of the difference vector according to the formula (4), this formula (10) will lead to formula (1), so that the LMS algorithm will obviously be equivalent to the one-dimensional elaboration of the OP method.

When x[k] is an uncorrelated signal, the vectors x[k] and x[k−1] are orthogonal. In general this will not be the case for input signals such as speech. Consequently, when implementing the above one-dimensional method the successive adaptations of w[k] may affect each other, which may lead to a poor convergence result. In order to find a solution to this problem the above article by K. Ozeki and T. Umeda proposes to extend the OP method to various dimensions. For simplicity only the two-dimensional method will be discussed hereinafter, which means that the projection will be made on a plane rather than on a line.

Figure 2B:
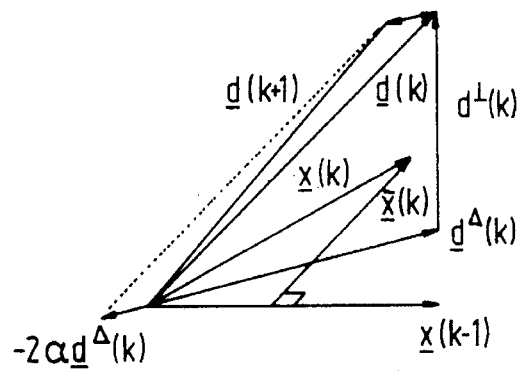

FIG. 2B shows in what way, by using a Gramm-Schmidt procedure, an orthogonal basis is obtained for the plane which is spanned by the vectors x[k] and x[k−1]. This is effected by leaving x[k−1] unchanged and by constructing $\tilde{x}[k]$ according to:

$$\tilde{\underline{x}}[k] = \underline{x}[k] - \frac{<\underline{x}[k],\underline{x}[k-1]>}{\|\underline{x}[k-1]\|^2} \underline{x}[k-1] \quad (11)$$

where $\tilde{x}[k]$ is orthogonal to $\tilde{x}[k-1]$ and $\tilde{x}[k]^T = (\tilde{x}[k], \ldots, \tilde{x}_{N-1}[k])$.

Subsequently, the projection is made of d[k] on the plane spanned by the two orthogonal vectors x[k−1] and $\tilde{x}$[k]. This is done in such a way that $d^L[k]$ is orthogonal to both $\tilde{x}$[k] and x[k−1], so the following will hold:

$$<\tilde{x}[k],d^L[k]> = 0 \text{ and}$$

$$<x[k-1],d^L[k]> = 0 \quad (12)$$

Alternatively, $d^A[k]$ may be written as the linear sum of $\tilde{x}$[k] and x[k−1], that is to say:

$$d^A[k] = c_0\tilde{x}[k] + c_1 x[k-1] \quad (13)$$

where $c_0$ and $c_1$ are scale factors. In order to be able to compute these scale factors two "new" residual signals are defined while assuming that s[k]=0:

$$\tilde{r}[k] = <\tilde{x}[k],d[k]> r_1[k-1] = <x[k-1],d[k]> = x^T[k-1].d[k] \quad (14)$$

In this context it should be observed that with the aid of the formulae (3), (11) and (14) and assuming that s[k]=0, $\tilde{r}[k]$ can be rewritten $$\tilde{r}[k] = \tilde{\underline{x}}^T[k] \cdot \underline{d}[k] = r[k] - \frac{<\underline{x}[k],\underline{x}[k-1]>}{\|\underline{x}[k-1]\|^2} r_1[k-1] \quad (15)$$

where r[k] is equal to the residual signal according to formula (3), whereas $r_1[k-1]$ is the inner product of the previous signal vector x[k−1] and the current difference vector d[k]. In the same way as in the case of the one-dimensional computation described hereinbefore, the following expressions for the scale factors $c_0$ and $c_1$ will now be obtained:

$$\tilde{r}[k] = c_0\|\tilde{x}[k]\|^2 r_1[k-1] = c_1\|x[k-1]\|^2 \quad (16)$$

By updating the difference vector in the opposite direction of $d^A[k]$ by means of:

$$d[k+1] = d[k] - 2\alpha d^A[k] \quad (17)$$

and by rewriting the above formulae, the following OP algorithm will be obtained:

$$\underline{w}[k+1] = \underline{w}[k] + 2\alpha \left[ \frac{\tilde{\underline{x}}[k]\tilde{r}[k]}{\|\tilde{\underline{x}}[k]\|^2} + \frac{\underline{x}[k-1]r_1[k-1]}{\|\underline{x}[k-1]\|^2} \right] \quad (18)$$

The algorithm (18) is in essence equivalent to the two-dimensional algorithm described in the above article by K. Ozeki. With each iteration k the OP algorithm provides an update in two orthogonal directions. Compared to the LMS algorithm this may generally lead to better convergence properties for autocorrelated input signals. However, it can be demonstrated that the number of multiplications, MDs, for he OP algorithm in the two-dimensional case is of the order of 5N, so that for obtaining proper convergence with autocorrelated (speech) signals a considerably larger number of computations is necessary, and consequently, considerably more complex and thus more expensive hardware.

As stated hereinbefore, signals that may be modelled by means of an AR process, form an important category of input signals and the OP method will be finalised hereinbelow for this type of signals. For simplicity it will further be assumed that the input signal can be modelled by means of an AR(1) process, thus:

$$[k] = ax[k-1] + n[k] \quad (19)$$

Subsequently, $\tilde{x}$[k] is defined as:

$$\tilde{x}[k] = x[k] - \hat{a}x[k-1] \quad (20)$$

where â is an estimate of the constant a. By calculating the inside product <x[k],x[k−1]> for an AR(1) process according to formula (19) and assuming that n[k] is uncorrelated, we will obtain:

$$<x[k],x[k-1]> = a\|x[k-1]\|^2 \quad (21)$$

This clearly shows that a possible estimate of â is provided by:

$$\hat{a} = \frac{<\underline{x}[k],\underline{x}[k-1]>}{\|\underline{x}[k-1]\|^2} \quad (22)$$

By substituting this value of a in formula (20), the same construction of $\tilde{x}$[k] as given by formula (12) will be obtained. Using formula (22) will demonstrate that the following holds for an AR(1) process:

$$<\tilde{x}[k],\tilde{x}[k-i]> = 0 \text{ for } i>1 \quad (23)$$

In a worded version this means that when constructing $\tilde{x}$[k] by means of an AR(1) process as given in formula (11), then $\tilde{x}$[k] will be orthogonal to all previously constructed vectors $\tilde{x}$[k−i]. The aforesaid now proves that in the case of AR(1) input signals, only the first part of the OP algorithm according to formula (18) needs to be used and the second part can be omitted, because this second part has only a disturbing effect. This will lead to the following OP algorithm for an AR(1) process:

$$\underline{w}[k+1] = \underline{w}[k] + 2\alpha \frac{\tilde{\underline{x}}[k]\tilde{r}[k]}{\|\tilde{\underline{x}}[k]\|^2} \quad (24)$$

It should be observed that from "A Geometric Interpretation of Adaptive Algorithms" by K. Kurosawa and T. Furusawa in Globecom Conference, Tokyo, Japan, 15–18 November 1987, pp. 49.7.1–49.7.5, an adaptive algorithm is known resembling formula (24). However, with this known algorithm, r[k] instead of $\tilde{r}$[k] is used as a result of which this known algorithm possesses poor properties of convergence.

The algorithm according to formula (24) changes the difference vector at each iteration k in a direction which is orthogonal with respect to all previous updates of the difference vector. This creates a difference with the OP algorithm, whereas the plane spanned by $\tilde{x}[k]$ and $x[k-1]$ need not be orthogonal to the plane of the previous update spanned by $\tilde{x}[k-1]$ and $x[k-2]$. The number of MDs necessary for this OP algorithm for AR(1) signals is of the order of 4N, so that only a limited simplification is obtained.

Since in practice â varies with time, in the sequel â will be given as a function of time and represented by â[k]. In "An Adaptive IIR Algorithm with Unimodal Performance Surfaces" by S. Karni and G. Zeng in IEEE Trans. on ASSP, Vol. ASSP 36, No. 2, February 1988; pp. 286–287, is described an algorithm having LMS properties which algorithm can be used for computing â[k]. In the present case this algorithm can be formulated as:

$$\hat{a}[k+1] = \hat{a}[k] + 2\beta \tilde{x}_0[k] x[k-1] \quad (25)$$

where $\beta$ is the adaptation constant. It can be proved that this algorithm converges to a same error measure as the one given by formula (22).

Figure 3A:
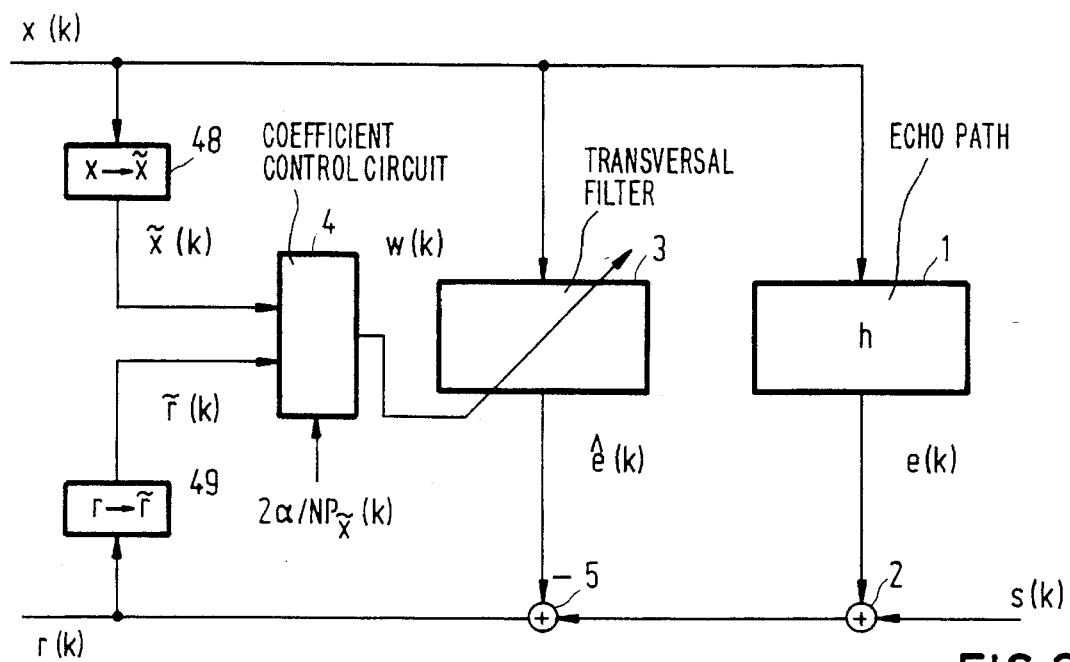
FIGS. 3A, 3B, 3C show block diagrams of an adaptive filter operating in accordance with an orthogonal projection method for signals of the AR(p) type.
Figure 3B:
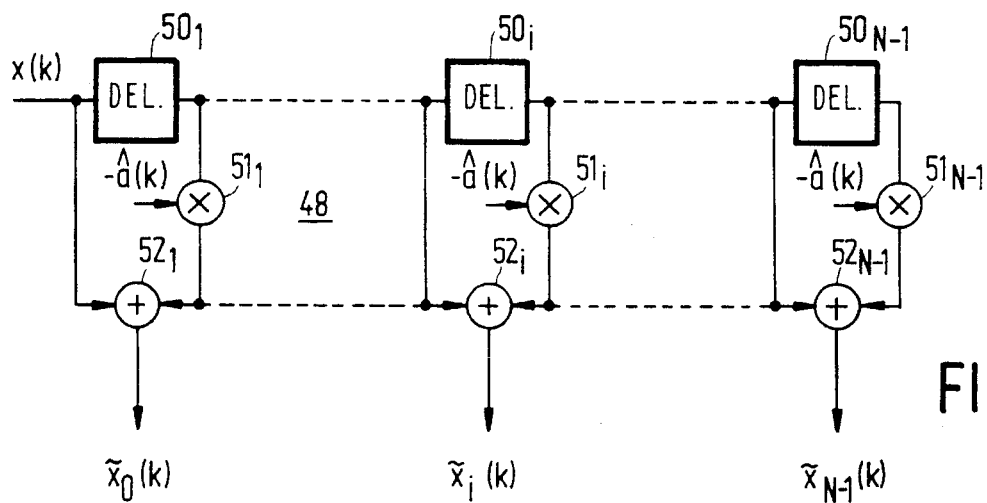
Figure 3C:
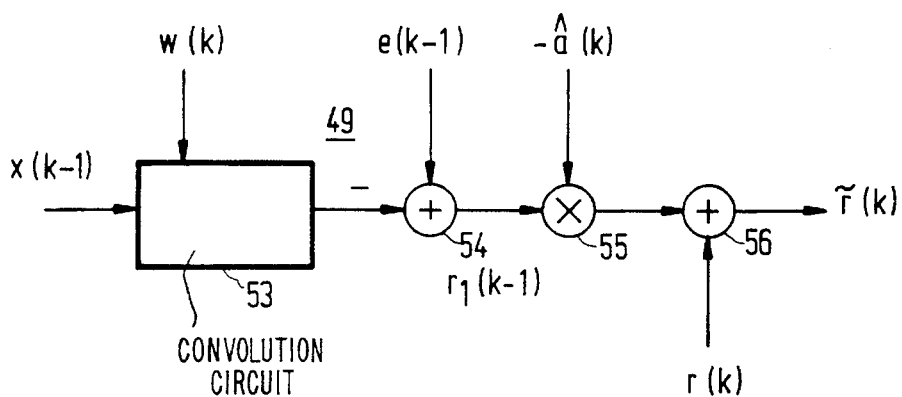

FIGS. 3A to 3C show an implementation of the algorithm according to formula (24). Formula (24) can be rewritten as:

$$w_i[k+1] = w_i[k] + 2\alpha \frac{\tilde{x}_i[k]\tilde{r}[k]}{NP_{\tilde{x}}[k]} \quad (26)$$

for $i = 0, 1, \ldots N-1$.

From formula (20) it follows that:

$$\tilde{x}_i[k] = x_i[k] - \hat{a}[k]x_i[k-1] \quad i=0,1,\ldots,N-1 \quad (27)$$

and from the formulae (15) and (22) that:

$$\tilde{r}[k] = r[k] - \hat{a}[k]r_1[k-1] \quad (28)$$

whereas, finally, according to formulae (4), (14) and (22) and because $x^T[k-1].h = e[k-1]$ it holds that:

$$r_1[k-1] = e[k-1] - \sum_{j=0}^{N-1} w_j[k]x[k-1-j]. \quad (29)$$

FIG. 3A shows a configuration of an echo canceller bearing similarity to that of FIG. 1A and wherein, for that matter, the same components have been referenced by the same Figures, but wherein the coefficient control circuit 4 is constructed in accordance with the OP algorithm for AR(1) signals. For this purpose, a pair of circuits 48 and 49 of which a possible structure is shown in the FIGS. 3B and 3C is extended to the coefficient control circuit 4 which, for the rest, may have the same structure as the one shown in FIG. 1C. Circuit 48 provides the conversion from [k] to $\tilde{x}[k]$ and circuit 49 the conversion from [k] to $\tilde{r}[k]$.

To this end circuit 48 comprises N sections, each including a delay stage $50_i$ with (i=0, 1, 2, . . . , N−1), a multiplier $51_i$ and an adder $52_i$. In each delay stage $50_i$ the input signal x[k] is delayed over a symbol interval. In each multiplier $51_i$ the output signal of the delay stage $50_i$ is multiplied by −â[k] and in each adder $52_i$ the output signal of the multiplier $51_i$ is summed with the input signal of the delay stage $50_i$, as a result of which, as can be simply derived, the desired conversion from x[k] to $\tilde{x}[k]$ is obtained.

FIG. 3C shows in more detail the structure of circuit 49. The latter comprises a convolution circuit 53 known per se, for example, a transversal filter, to produce the convolution of w[k] with x[k−1]. The output signal of circuit 53 is substracted from the signal e[k−1] in an adder 54, whose output signal is subsequently multiplied by −â[k] in a multiplier 55, while finally the desired expression for $\tilde{r}[k]$ according to formula (28) is obtained by adding to r[k] the output signal of multiplier 55 in an adder 56.

The FIGS. 3A–C also demonstrate that for the computation of the OP algorithm for AR(1) signals according to formula (24) a complex and hence costly circuit is necessary which in integrated form is bulky and hence less attractive. As already mentioned in the opening paragraph, it is an object of the invention to simplify an OP algorithm for AR(1) signals in a manner such that it has the complexity of the order of magnitude of that of the LMS algorithm while retaining the advantageous convergence properties of the OP algorithm for AR(1) signals. This reduction of complexity is realised in two steps. In the first place the extra convolution in the computation of $r_1[k-1]$ according to formula (14) is replaced with a single multiplication. To this end the following approximation is used for small values of $\alpha$, while assuming that the adaptations of the coefficients are orthogonal on average:

$$\underline{d}[k] \approx \left(1 - \frac{2\alpha}{N}\right)\underline{d}[k-1] \quad (30)$$

The fact that this assumption is permissible may be concluded from the above article by K. Kurosawa and T. Furusawa. Consequently, $r_1[k-1]$ can be written as:

$$r_1[k-1] = \underline{x}^T[k-1]\underline{d}[k] \approx \quad (31)$$
$$\left(1 - \frac{2\alpha}{N}\right)\underline{x}^T[k-1]\underline{d}[k-1]$$
$$= \left(1 - \frac{2\alpha}{N}\right)r[k-1]$$

which, together with formula (28), leads to the following approximate $\tilde{r}'[k]$ of $\tilde{r}[k]$:

$$\tilde{r}'[k] = r[k] - \hat{a}[k]\left(1 - \frac{2\alpha}{N}\right)r[k-1] \quad (32)$$

Secondly, it is assumed that â[k]≈ . . . ≈â[k−N−1]. This is permitted because â[k] varies very slowly with time. Assuming this, an approximate $\tilde{x}'[k]$ of $\tilde{x}[k]$ can, when using formula (20), be written as:

$$\tilde{x}_i'[k] = x[k-i] - \hat{a}[k-i]x[k-1-i] \quad i=0,1,\ldots,N-1 \quad (33)$$

so that:

$$\tilde{x}_i'[k] = \tilde{x}_0'[k-i] \quad (34)$$

Consequently, not more than a single multiplication and a delay line of N stages is necessary for computing $\tilde{x}'[k]$, as will be further explained hereinbelow.

From the formulae (22) to (24) and (30) to (34) the efficient OP algorithm for AR(1) signals according to the invention will follow:

$$\underline{w}[k+1] = \underline{w}[k] + 2\alpha \frac{\tilde{x}'[k]\tilde{r}'[k]}{NP_{\tilde{x}}[k]} \quad (35)$$

where:

-continued $$\tilde{x}^T[k] = \tilde{x}_0'[k], \ldots, \tilde{x}_0'[k-N+1] \text{ (see (34))} \quad (36)$$

$$\tilde{x}_0'[k] = x[k] - \hat{a}[k]x[k-1]$$

$$\tilde{r}'[k] = r[k] - \hat{a}[k]\left(1 - 2\frac{\alpha}{N}\right)r[k-1]$$

$$\hat{a}[k+1] = \hat{a}[k] + 2\beta\tilde{x}_0'[k]x[k-1]$$

$$P_{\tilde{x}}[k+1] = P_{\tilde{x}}[k] + (1-\gamma)\tilde{x}_0'^2[k]$$

The complexity of this algorithm is of the order of 2N MDs, so that the above objects are achieved.

The unvoiced part of speech can generally be suitably modelled with an AR(p) process in which $p \approx 8-12$. The formulae (35) and (36) showing the algorithm according to the invention for AR(1) signals may simply be converted into formulae that hold for an arbitrary value of p. For an arbitrary value of p, formula (35) remains unchanged, but it holds that:

$$\tilde{x}^T[k] = \tilde{x}_0'[k], \ldots, \tilde{x}_0'[k-N+1] \quad (37)$$

$$\tilde{x}_0'[k] = x[k] - \sum_{j=1}^{p} \hat{a}_j[k]x[k-j]$$

$$\tilde{r}'[k] = r[k] - \sum_{j=1}^{p} \hat{a}_j[k]\left(1 - 2\frac{\alpha}{N}\right)^j r[k-j]$$

$$\hat{a}_j[k+1] = \hat{a}_j[k] + 2\beta\tilde{x}_0'[k]x[k-j]$$
$$P_{\tilde{x}}[k+1] = P_{\tilde{x}}[k] + (1-\gamma)\tilde{x}_0'^2[k]$$

Even for $p>1$ it holds that the computational complexity of successive values of w[k] remains of the order of 2 MDs, whereas the convergence properties for autocorrelated input signals is yet highly satisfactory.

Figure 4:
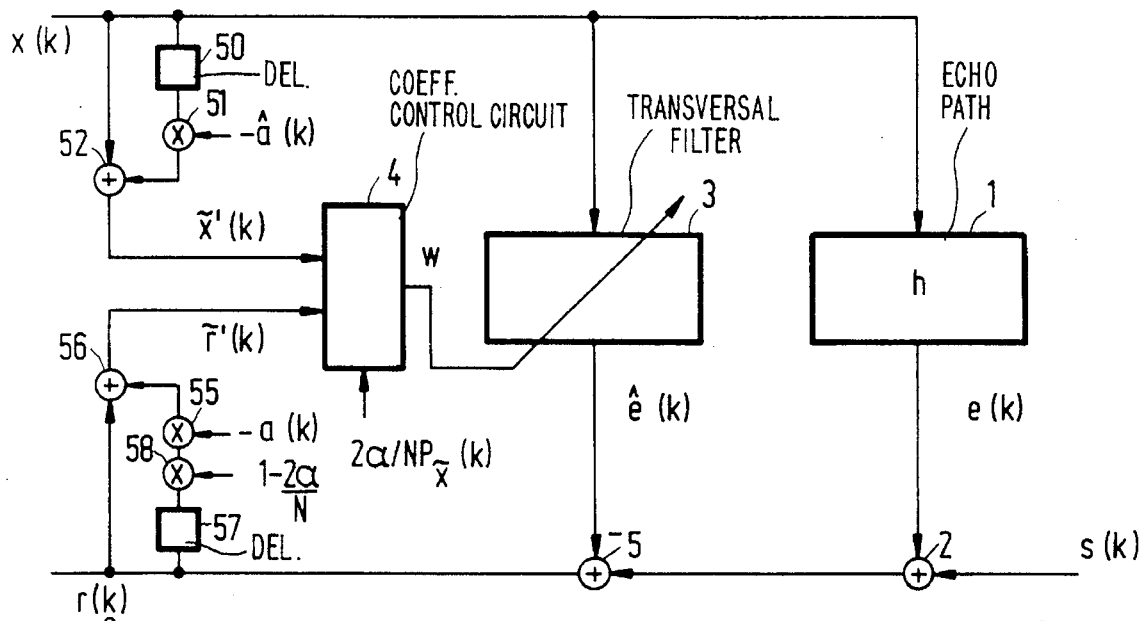
FIG. 4 shows a block diagram of an adaptive filter operating in accordance with the efficient orthogonal projection method according to the invention.

FIG. 4 shows an echo canceller operating on the basis of the algorithm according to the invention, in which canceller the same components have been referenced the same as the components according to FIGS. 1 and 3. In this circuit the values of w[k] are computed on the basis of the following equations which can directly be derived from the formulae (35) and (36):

$$w_i[k+1] = w_i[k] + 2\alpha \frac{\tilde{x}_0'[k-i]\tilde{r}'[k]}{NP_{\tilde{x}}[k]} \quad (38)$$

for $i = 0, 1, \ldots, N-1$ where $\tilde{r}'[k]$ satisfies the formula (36) or (37) respectively, for p=1 and p>1 and where:

$$\tilde{x}_0'[k-i] = x[k-i] - \sum_{j=1}^{p} \hat{a}_j[k]x[k-i-j] \quad (39)$$

which follows directly from the formulae (34) and (37).

As appears from FIG. 4 not more than a single section of the circuit shown in FIG. 3b is necessary for computing $\tilde{x}'[k]$ in circuit 48', which is to say, a single delay line 50, a single multiplier 51 and a single adder 52. The circuit 49 for computing $\tilde{r}'[k]$ comprises a delay stage 57 to delay the signal r[k] over one symbol interval, a multiplier 58 to multiply the output signal of stage 57 by 1−2α/N' the multiplier 55 coupled to the output of the multiplier 58 and the adder 56 for summing the output signal of the multiplier 55 and the signal r[k]. It will be evident that this is a considerably simpler and hence more attractive configuration for an echo canceller than the one according to FIGS. 3, whereas the convergence obtained for AR(1) signals is virtually the same.

Figure 5:
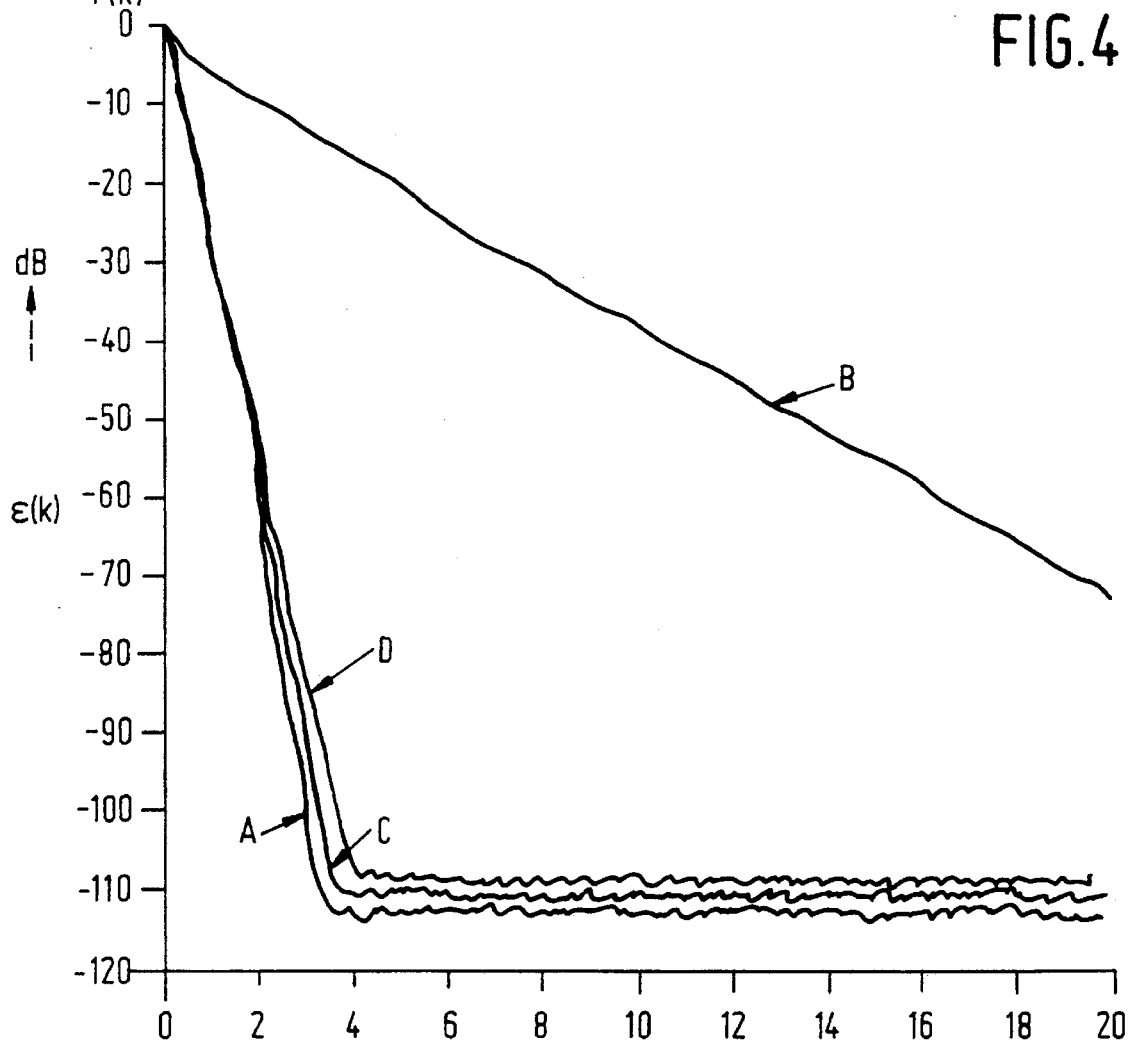
FIG. 5 shows a graphic representation of the results achieved with the various filters.

FIG. 5 shows the results obtained with the echo cancelled according to the FIGS. 1, 3 and 4. In this Figure the number of iterations is shown along the horizontal axis, each line of the scale division representing 2000 iterations, and the obtained relative error measure in dB is shown along the vertical axis. The chosen values were 0.25 for the adaptation constant $\alpha$, 0.01 for $\beta$, 0.9 for $a_1$, while N was equal to 200. In this Figure curve A shows the error measure that can be obtained with the aid of LMS algorithm in the case of an uncorrelated input signal, whereas curve B shows the error measure that can be obtained with the aid of the LMS algorithm in the case of an input signal of the AR(1) type. From these two curves it appears to what large extent the convergence behaviour of the LMS algorithm is degraded if the input signal is correlated.

The curves C and D in FIG. 5 show for an input signal of the AR(1) type the error measure that can be obtained with the aid of the OP algorithm according to formula (23) (Curve 5C) and the error measure that can be obtained with the aid of the algorithm according to the invention (Curve 5D). Comparison of these two curves with curve A demonstrates that both with the OP algorithm and with the algorithm according to the invention, with an input signal of the AR(1) type, a measure and a convergence speed are obtained comparable to those of the LMS algorithm in the case of an uncorrelated input signal whereas, however, the algorithm according to the invention can be implemented in a considerably simpler manner as has been shown hereinbefore with reference to FIG. 4.

We claim:

1. Adaptive discrete-time filter comprising a transversal filter for forming an estimated echo signal ê during intervals k from a current sample and N−1 last synchronous samples of an input signal x provided by a delay line, in accordance with an impulse response of said transversal filter which is adapted by adjusting coefficients $w_i$ of said transversal filter, applied to said current and N−1 last prior samples, with i=0, 1, 2, . . . , N−1, for realizing said impulse response, means for adaptively determining the filter coefficients $w_i$ and for supplying the determined coefficients to said transversal filter, means for forming a residual signal r by subtracting the estimated echo signal ê from a signal e+s, where e is representative of an actual echo signal caused by said input signal e and s is a noise-like signal, characterized in that the synchronous samples of the input signal are of a type representable by an autoregressive model of the order of p in accordance with the formula:

$$x[k] = \sum_{j=1}^{p} a_j x[k-j] + n[k]$$

where n is an uncorrelated white noise (random) signal and in that said determining means is configured for determining the coefficients $w_i$ during the successive sample intervals k in accordance with the formula:

$$w_i[k+1] = w_i[k] + 2\alpha \frac{\tilde{x}_0'[k-i]\tilde{r}'[k]}{NP_{\tilde{x}'}[k]_3} \text{ for } i=0,1,\ldots,N-1$$

where:

-continued $$\tilde{x}_0'[k-i] = x[k-i] - \sum_{j=1}^{p} \hat{a}j[k] \times [k-i-j]$$

$$\tilde{r}[k] = r[k] - \sum_{j=1}^{p} \hat{a}j[k]\left(1 - 2\frac{\alpha}{N}\right)^j r[k-j]$$

and where $\alpha$ is an adaptation constant with $0<\alpha<1$, $P_{\tilde{x}}'$ is an estimate of the power of x and âj is an estimate of a parameter $a_j$ of the autoregressive model.

2. Adaptive discrete-time filter as claimed in claim 1, characterized in that $P_{\tilde{x}}'$ satisfies the following formula:

$$P_{\tilde{x}}'[k+1] = P_{\tilde{x}}'[k] + (1-j)\tilde{x}_0'^2[k]$$

where $\alpha$ is a constant with $0<\alpha<1$.

3. Adaptive discrete-time filter as claimed in claim 2, characterized in that the estimate $\hat{a}_j$ of the parameter $a_j$ satisfies the following formula:

$$\hat{a}_j[k+1] = \hat{a}_j[k] + 2.\beta\tilde{x}_0'[k]x[k-j]$$

for j=1, 2, . . . , p, where $\beta$ is a constant.

4. Adaptive discrete-time filter as claimed in claim 1 or 2, characterized in that the estimate âj of the parameter $a_j$ satisfies the following formula:

$$\hat{a}_j[k+1] = \hat{a}_j[k] + 2.\beta\tilde{x}_0'[k]x[k-j]$$

for j=1, 2, . . . , p, where $\beta$ is a constant.

* * * * *